United States Patent [19]
Wadsworth et al.

[11] Patent Number: 6,130,634
[45] Date of Patent: Oct. 10, 2000

[54] RESISTOR STRING DAC WITH IMPROVED SPEED

[75] Inventors: Mark V. Wadsworth, Sierra Madre, Calif.; Kirk D. Peterson, Plano, Tex.

[73] Assignee: Texas Instruments Incorporated, Dallas, Tex.

[21] Appl. No.: 09/219,173

[22] Filed: Dec. 22, 1998

Related U.S. Application Data

[60] Provisional application No. 60/068,663, Dec. 23, 1997.

[51] Int. Cl.[7] .............................. H03M 1/66; H03M 1/78
[52] U.S. Cl. ........................................... 341/144; 341/154
[58] Field of Search ...................................... 341/144, 154

[56] References Cited

U.S. PATENT DOCUMENTS

| | | |
|---|---|---|
| 5,175,548 | 12/1992 | Kawada ................................. 341/144 |
| 5,703,588 | 12/1997 | Rivoir et al. .............................. 341/154 |
| 5,969,657 | 10/1999 | Dempsey et al. ........................ 341/154 |
| 5,977,898 | 11/1999 | Ling et al. ................................ 341/144 |
| 6,049,300 | 4/2000 | Shoval ..................................... 341/144 |

*Primary Examiner*—Trong Phan
*Attorney, Agent, or Firm*—Alan K. Stewart; Wade James Brady, III; Frederick J. Telecky, Jr.

[57] ABSTRACT

The speed performance of a resistive DAC can be improved by tailoring the selection switch size to the node location. For the simple case of a DAC used in a SAR-based ADC, the MSB code, which is activated during each SAR search, is the speed-limiting bit. Increasing the size of the switch on the node corresponding to the MSB will reduce the on-resistance of the FET and, therefore, the total resistance to ground from the node. The on-resistance can be changed markedly without substantially changing the total capacitance at the output node, since the sum of the parasitic from the remaining switches will far exceed the additional capacitance created by increasing the MSB FET.

6 Claims, 1 Drawing Sheet

6,130,634

RESISTOR STRING DAC WITH IMPROVED SPEED

This application claims priority under 35 USC §119 (e)(1) of provisional application Ser. No. 60/068,663 filed Dec. 23, 1997.

FIELD OF THE INVENTION

This invention relates to digital to analog converters, and more particularly to a resistor string digital to analog utilizing a single switch for each node selection switch in which each switch uses cascode CMOS devices, with the switch for the MSB (Most Significant Bit) having a reduced resistance.

BACKGROUND OF THE INVENTION

Successive approximation register (SAR) analog-to-digital converters (ADC) require digital-to-analog converters (DAC) which produce precise reference values to determine the digital equivalent of an analog input signal. One of the primary factors limiting the ultimate speed of SAR-based ADCs is the settling time of the DAC. For proper operation, the DAC must settle to a voltage level that is accurate to at least as many bits as the resolution of ADC. In resistor string DACs, the precise reference voltage is produced by tapping across the appropriate nodes in a series-connected string of resistors. The settling time is determined by the net resistance, the capacitance that must be driven at that node, and the change in applied voltage. These conflicting criteria must be chosen for each design to optimize DAC performance.

State-of-the-art resistor string DACs use a single switch size for each node selection switch in the resistor chain. This size is selected to optimize overall device speed and is dependent upon the size of the unit resistor in the DAC. This chosen FET size produces a small parasitic capacitance at each node, with the sum of the output node capacitance from all of the switches traded against the maximum total resistance to ground from the output node. For the typical switch size, the on-resistance of the FET can be comparable to the resistance of the resistor chain. Thus the device settling time can be optimized for some nodes, but can be greatly limited by the FET on-resistance at other nodes. The worst-case settling time will be at the MSB case. This case requires the largest possible change in voltage at the output node (nominally one-half that of the reference supply voltage). In addition, the resistance of the selected node to ground will be one-half that of the total resistor chain, which is the largest possible value. Thus the maximum RC time constant will be associated with the MSB.

SUMMARY OF THE INVENTION

The speed performance of a resistive DAC can be improved by tailoring the selection switch size to the node location. For the simple case of a DAC used in a SAR-based ADC, the MSB code, which is activated during each SAR search, is the speed-limiting bit.

Increasing the size of the switch on the node corresponding to the MSB will reduce the on-resistance of the FET and, therefore, the total resistance to ground from the node. The on-resistance can be changed markedly without substantially changing the total capacitance at the output node, since the sum of the parasitic from the remaining switches will far exceed the additional capacitance created by increasing the size of the MSB FET. Thus, for the MSB node, C will remain roughly the same but $R_{Switch}$ (which consists of the sum of the switch resistance and one-half of the total resistor string resistance) will decrease, thereby reducing the RC time constant. Depending upon the design constraints (power, resolution, etc.), this can nearly double the maximum speed of the DAC for a given number of bits of resolution.

DESCRIPTION OF A PREFERRED EMBODIMENT

Figure 1:
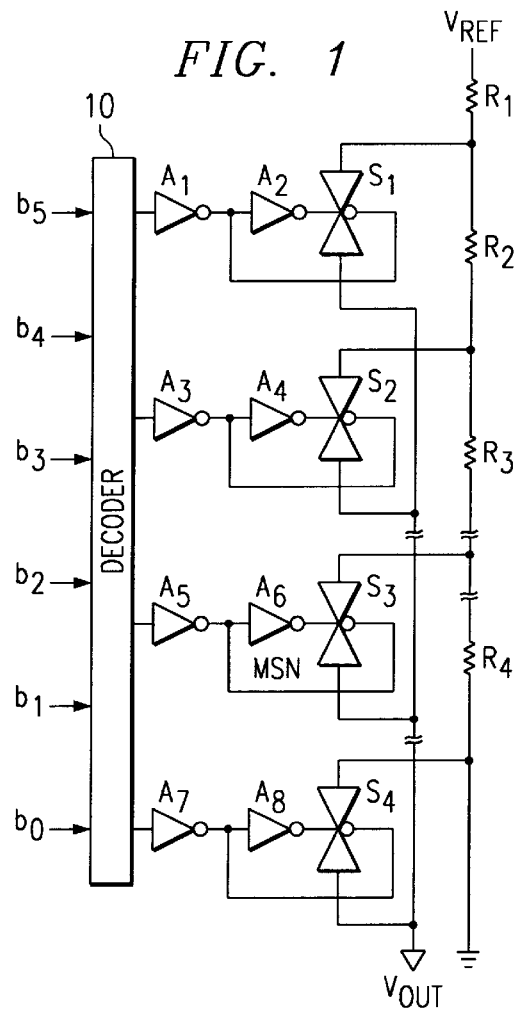
FIG. 1 illustrates an example of a 6-bit Resistor String DAC.

FIG. 1 shows a block diagram of a 6-bit resistor string DAC of the present invention, only four switches are shown. The six-bit inputs b0–b5 are input to a Decoder 10 with analog outputs to several switches, only S1–S4 are illustrated. Each analog input is applied to a switch trough two amplifiers, for example, Switch S1 is connected to amplifiers A1 and A2, Switch S1 is connected to amplifiers A1 and A2, Switch S2 is connected to amplifiers A3 and A4, Switch S3 is connected to amplifiers A5 and A6, and Switch S4 is connected to amplifiers A7 and A8. Each switch is connected to a resistor string, shown in part and represented by resistors R1–R4. Each amplifier is also connected to Vout. The MSB, for example is applied to Switch S3.

Figure 2:
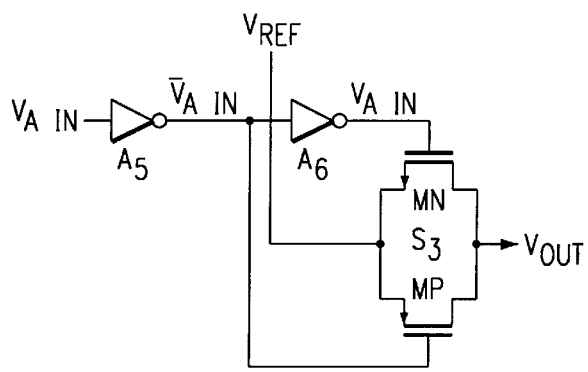
FIG. 2 illustrates one switch station of the Resistor String Dac.

FIG. 2 shows and example of a switch circuit in which the switch is implemented by an N-CMOS MN and a P-CMOS MP. The analog voltage $V_{ain}$, out of decoder 10, is applied to amplifier A5 and output as Vain which is applied to A6 and to the gate of MP. The output of amplifier A6 is applied to the gate of MN. Vref is applied to the connected drains of MN and MP, and Vout is taken from the connected sources of MN and MP. MN and MP are switched on or off depending upon the comparison of Vain to Vref.

Figure 3:
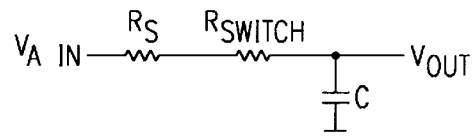
FIG. 3 illustrates the resistive and capacitive elements of the Resistor String DAC.

FIG. 3 shows an equivalent circuit showing the resistive and capacitive components associated with each switch circuit. Rs is the distributed resistance of each switching circuit between Vain and Vout. Rswitch is the resistance through each switch, and C is the capacitance associated with each switching circuit. The rise time of each circuit is controlled by the relative R-c time constant of the circuit. By decreasing the resistance, the Vout rise time can be improved, allowing Vout to reach it peak value faster. Rswitch is the resistance through the switching circuit made up of devices MN and MP. It is know that the resistance through a CMOS device can be controlled by the channel width and length of the device. A general discussion of CMOS devices and the their channel width and length characteristics is found in U.S. Pat. No. 5,515,010, and several other references discussed therein. These references are hereby incorporated by reference herein.

By modifying the channel widths and lengths of MN and MP, the resistance of Rswitch can be reduced. For example, if the size of Width/Length (W/L) of each of the switches, except for S3, of FIG. 2 is =10/1 for both NMOS and PMOS devices , then the W/L of S3 is made 20/1. The size of the transmission gate for the MSB has been doubled as compared to the other bits. The W/L of S3 reduces the total resistance associated with the S3 overall circuit, allowing a faster rise time for the MSB, which has the greatest voltage value.

Figure 4:
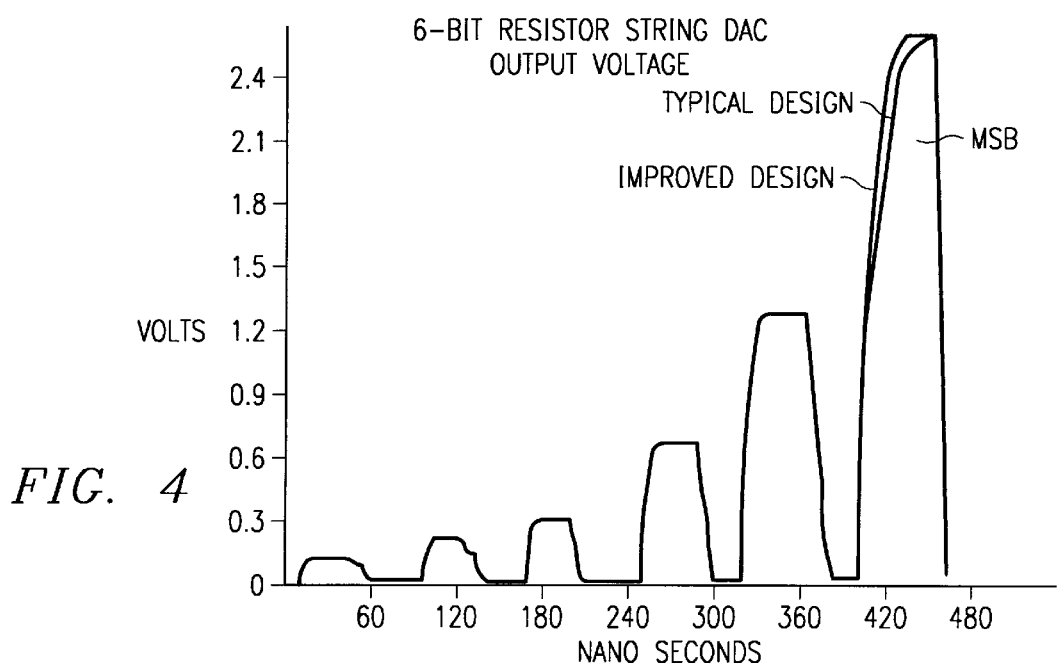
FIG. 4 shows the output voltage vs time of the 6-bit Resistor String DAC, and the improved performance of the MSB.

The improvement resulting from reducing resistance of Switch S3 is illustrated in FIG. 4. When the resistance value of the switch for the MSB switch is the same value as the other switches, then it will take a longer time for the voltage pulse of MSB to reach it value as indicated by the pulse edge labeled as "Typical Design". By reducing the resistance value of the MSB switch, the voltage pulse rises to its value in a shorter length of time as indicated by the pulse edge labeled "Improved Design".

As can be seen from FIG. 4, when the selection switch for the MSB is doubled in size, the resulting DAC settles significantly faster. For the case described herein, the typical design (all selection switches the same size) does not settle to the MSB level to within 6-bit accuracy within the allotted time of 40 ns. However, the improved design settles to the MSB level with the 6-bit accuracy in about 20 ns. It can also be seen that only the MSB has a settling problem. Therefore, increasing the size of the selection switch for the MSB produces a significantly faster DAC for use in SAR-based ADCs.

The same approach can be applied to the more complicated case of a standard resistor string DAC used in a generic application. In this case, the size of each node select FET will increase as the resistor string is traversed from the first to the MSB bit, then decreases in an identical fashion toward the full-scale node. The net effect is an average of net resistance which produces an optimized settling time over all nodes.

What is claimed:

1. A resistor string digital to analog converter, comprising:
    a decoder having a plurality of analog outputs, one of which is for the most significant bit of the analog out;
    a plurality of selection switches connected to a reference voltage and each switch connected to an analog voltage output from the decoder, including a voltage representative of the most significant digital bit;
    each switch having a switch resistance; and
    the resistance of the switch for the most significant bit being less in magnitude that the resistance of the other switches.

2. The resistor string digital to analog converter according to claim 1, wherein the resistance of the switch for the most significant bit is one-half of the value for the remaining switches.

3. The resistor string digital to analog converter according to claim 1, wherein two of the plurality selection switches have a resistance less that the remaining switches, and a greater resistance than the switch for the most significant bit.

4. A resistor string digital to analog converter, comprising:
    a decoder having a plurality of analog outputs, one of which is for the most significant bit of the analog out;
    a plurality of selection switches connected to a reference voltage and each switch connected to an analog voltage output from the decoder, including a voltage representative of the most significant digital bit;
    each switch constructed with a N-CMOS device and P-CMOS device which form a switch resistance, the switch resistance for the switch for the most significant bit being less than the resistance for the other plurality of selection switches.

5. The resistor string digital to analog converter according to claims 4, wherein each switch N-CMOS and P-CMOS device has a channel width and length, the channel width and length of the P-CMOS and N-CMOS devices for the most significant bit switch being different from the channel widths and lengths of the non-most significant bit switches.

6. The resistor string digital to analog converter according to claim 5, wherein the Width/Length ratio of the non-most significant bit switches is 10/1 and the Width/Length ratio for the most significant bit switches is 20/1.

* * * * *